United States Patent [19]

Yamada et al.

[11] 3,996,540
[45] Dec. 7, 1976

[54] INDICATING DEVICE FOR TUNING APPARATUS

[76] Inventors: Yasuhiro Yamada, Neyagawa; Kazuyoshi Tsukamoto, Hirakata; Yoshiaki Sakauchi, Tenri; Kazufumi Ushijima, Hirakata; Hisao Kanou, Osaka, all of Japan

[22] Filed: Feb. 13, 1975

[21] Appl. No.: 549,667

[30] Foreign Application Priority Data

Feb. 21, 1974 Japan .............................. 49-20889
May 30, 1974 Japan .............................. 49-61497
July 18, 1974 Japan ......................... 49-85972[U]

[52] U.S. Cl. .................................. 334/15; 334/16; 334/86; 325/452; 325/465; 313/501
[51] Int. Cl.² ...................... H03H 5/12; H03J 3/06; H03J 5/04
[58] Field of Search .................. 334/14, 15, 16, 86, 334/87; 325/452, 465; 313/499, 500, 501; 324/122

[56] References Cited

UNITED STATES PATENTS

| | | | |
|---|---|---|---|
| 3,495,195 | 2/1970 | Ribour | 334/15 |
| 3,519,939 | 7/1970 | Tashima | 334/15 X |
| 3,753,119 | 8/1973 | Close | 334/86 |
| 3,766,474 | 10/1973 | MacDonald | 324/122 |
| 3,795,863 | 3/1974 | Umeda et al. | 313/500 |
| 3,846,707 | 11/1974 | Sakamoto et al. | 334/15 |
| 3,851,254 | 11/1974 | Merrell et al. | 334/87 |
| 3,882,400 | 5/1975 | Hamada | 325/465 |

Primary Examiner—Saxfield Chatmon, Jr.
Attorney, Agent, or Firm—Darby & Darby

[57] ABSTRACT

An apparatus for indicating a tuned frequency of a tuner of a radio or television receiver, said tuner comprising a tank circuit employing a voltage controlled variable capacitance diode as a circuit element, which diode is supplied in a reverse direction with a scanning control voltage from a solid state potential memory device, which control voltage is set as a result of tuning of said tuner, said indicating apparatus comprising a plurality of light emitting diodes arranged in a line, each illuminating the corresponding frequency indicating region out of a plurality of divided frequency indicating regions of a frequency band to be received by said receiver, said regions being arranged in succession to cover said frequency band, and a corresponding plurality of drivers responsive to said control voltage for energizing the corresponding light emitting diode for illuminating the corresponding frequency region to which said tuned frequency pertains. In a preferred embodiment of the invention, the frequency indicating regions to be covered by the adjacent light emitting diodes are adapted to be overlapped in part at the ends thereof, so that the frequency in the overlapped portion in the region is indicated by said two adjacent light emitting diodes.

14 Claims, 16 Drawing Figures

FIG. 2
| AM | 540 ⊙A | 752 ⊙B | 964 ⊙C | 1176 ⊙D | 1388 ⊙E | 1600 ⊙F |
|---|---|---|---|---|---|---|
| FM | 75 | 78 | 81 | 84 | 87 | 90 |
FIG. 3
| VHF | 2 ⊙A | 4 ⊙B | 6 ⊙C | 8 ⊙D | 10 ⊙E | 12 ⊙F |
|---|---|---|---|---|---|---|
| UHF | 13 | 23 | 33 | 43 | 53 | 63 |
FIG. 4
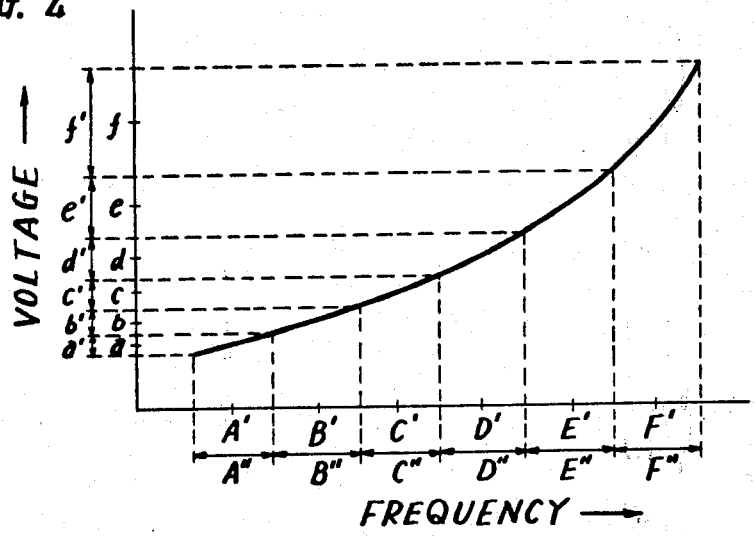
FIG. 8
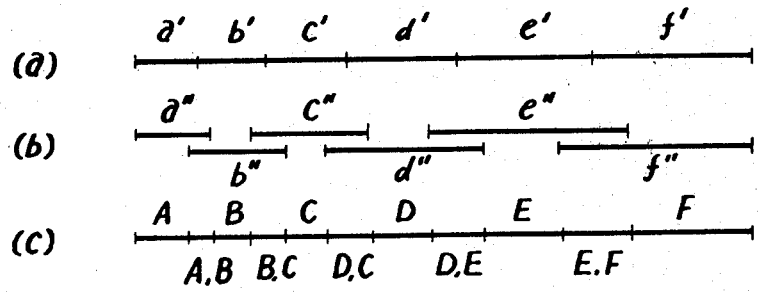

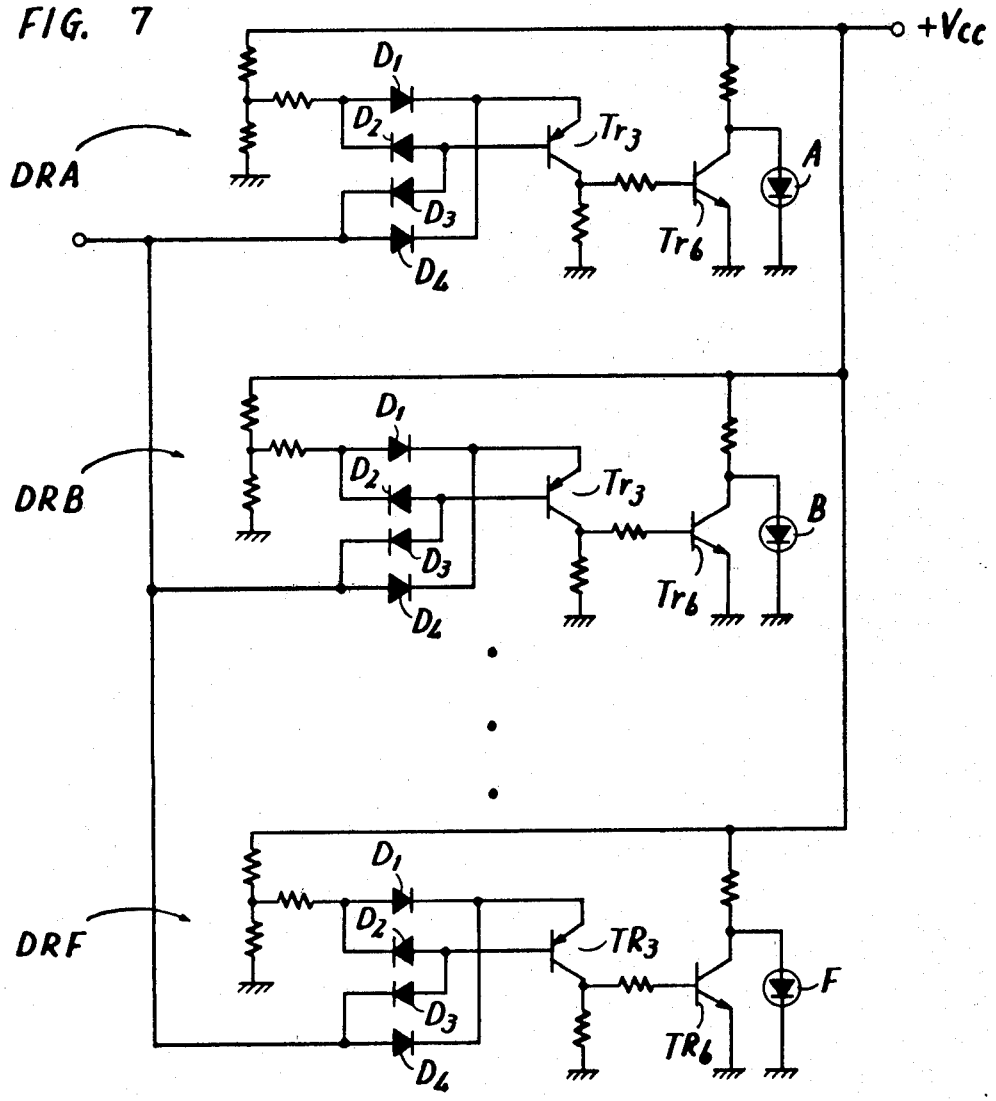
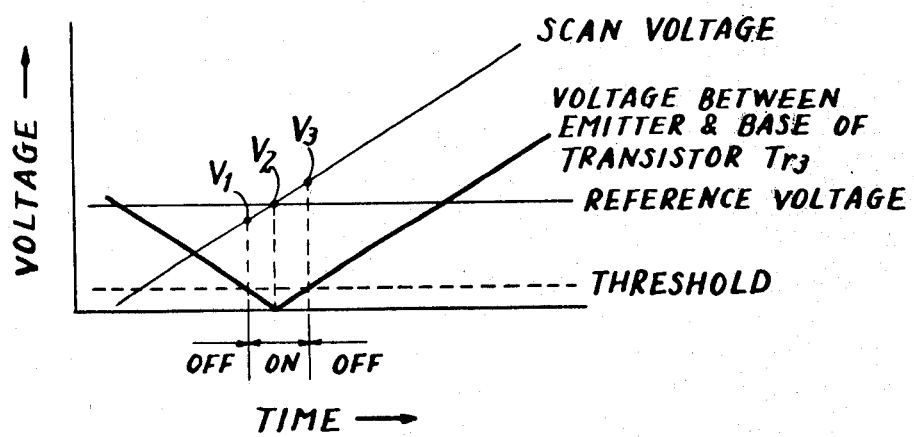

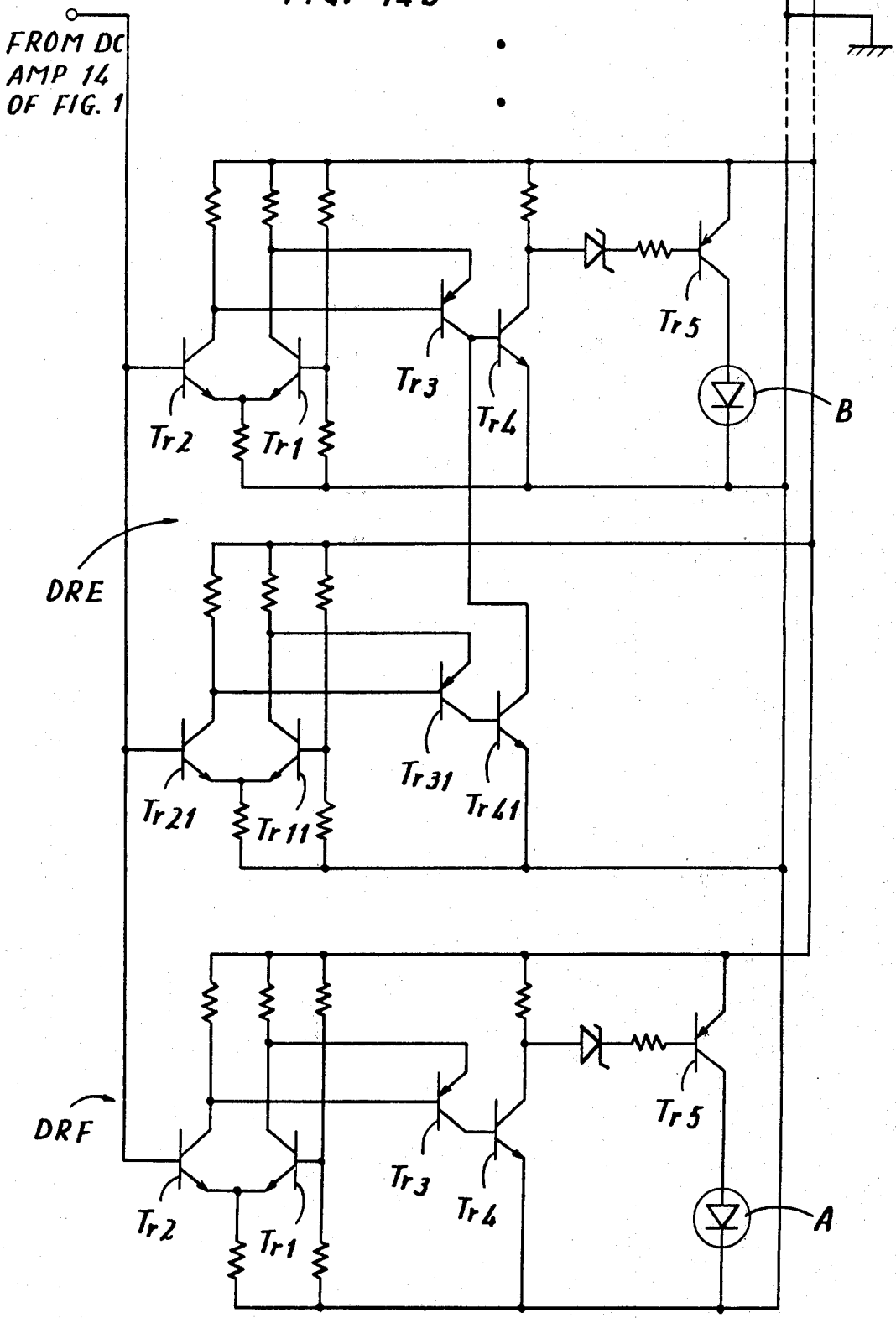

INDICATING DEVICE FOR TUNING APPARATUS

BACKGROUND OF THE INVENTION

1. Field of the Invention

The present invention relates to an indicating device for a tuning apparatus. More specifically, the pressent invention relates to a device for indicating a tuned frequency in a tuning apparatus employing a voltage controlled variable reactance device.

2. Description of the Prior Art

Recently an automatic tuning apparatus employing a voltage controlled variable capacitor has been widely used in radio receivers, television receivers and the like. Such a voltage controlled variable capacitor uses a capacitance formed at a barrier portion of a diode, variable as a function of a reverse voltage applied thereacross and is known as a variable capacitance diode. In succh an automatic tuning apparatus, it is necessary to provide a voltage supply capable of providing a voltage variable as chosen in response to manual operation, which causes a capacitance with which the tuning apparatus selects a desired tuning frequency and thus selects a desired transmitting station. It is well known that such a voltage is closely related with the tuning frequency and thus the selected transmitting station.

In the receiving equipment employing such a tuning apparatus, it is most preferred to provide an indicator which indicates a tuned frequency and/or selected transmitting station. For that purpose it would be obvious to those skilled in the art to employ a visual indication by means of a volt meter for indicating the voltage applied to the voltage controlled variable capacitance diode in terms of a tuned frequency and/or a selected transmitting station. Nevertheless, such an indication by means of a volt meter is disadvantageous and less preferred in that a response rate thereof is slow and design of the receiver is limited thereby, the structure thereof is not very shock-proof and reliability thereof is small. It is desired that a preferred indicator is provided which is suitable for use in a receiver employing a tuning circuit using a voltage controlled variable reactance device, such as a voltage controlled variable capacitor. The present invention was completed to achieve such a purpose.

One type of such a voltage supply for providing a voltage variable in response to manual operation to a variable capacitance diode comprises a capacitor and a charging/discharging circuit therefor, a voltage across the capacitor, as selected in response to a tuning output, being applied to the variable capacitance diode. More specifically, the capacitor is charged or discharged by the charging/discharging circuit in response to manual operation until a voltage across the capacitor causes capacitance in the diode with which the tuning circuit tunes to a given frequency to provide a tuning output therefrom when the charging/discharging circuit is disabled to discontinue to charge or discharge the capacitor, so that the voltage thus provided across the capacitor remains the same. If another tuning frequency is desired, the charging/discharging circuit is again enabled through manual operation and the abovementioned operation is repeated until another frequency is tuned.

A voltage storing device of interest in connection with the present invention is disclosed in U.S. Pat. No. 3,753,110, issued Aug. 14, 1973 to Hironosuke Ikeda et al. and assigned to Sanyo Electronic Co., Ltd. the same assignee as that of the present invention. As set forth in the referenced patent, Professor Takehiko Takahashi and Assistant Professor Osmu Yamamoto, Technological Department of Nagoya University, announced their study on the electrochemical potential memory device by the use of a solid state electrolyte at the 22nd annual assembly of Japan Chemical Association held on April 5th to 7th, 1969. Briefly stated, this device comprises an Ag elecrode as a cathode, an Ag-Te alloy electrode as an anode, and a solid state electrolyte having high ion conductivity, such as $RbAg_4I_5$ sandwiched between both electrodes. When a DC voltage is applied to the device so that the Ag electrode may be negative, a portion of Ag contained in the Ag-Te alloy electrode migrates over to the Ag electrode, resulting in a decreased activity of Ag in the Ag-Te alloy, and thus an increased potential difference between both electrodes. The inventors of this device termed this state of operation as "charging". When the polarity of the applied DC voltage is reversed to that of the former case, Ag is refilled into the AG-Te alloy, resulting in the decreased potential difference and returns to the initial value eventually. The inventors of this device termed this state of operation as "discharging". Study disclosed by the inventors of this device indicates that the electromotive force generated by the abovementioned charging or discharging current can cause linear change to some extent with respect to the charging or discharging time. Thus this device makes it possible to effect write-in and non-destructive read-out operation while preserving relatively linear relation between the charging or discharging time and terminal voltage, and in addition, it can hold the memory condition for a relatively longer period of time. The referenced patent further discloses an improved electrochemical potential memory device. More specifically, FIG. 6 of the referenced patent shows an improved electrochemical potential memory device for eliminating the IR drop across the resistance in the electrolyte and the overvoltage caused by dissolution or deposition of Ag, which is basically characterized by the provision of an auxiliary cathode that comprises an output terminal for detecting the potential separately from the abovementioned cathode available for the input terminal for the current conduction. In view of these advantageous characteristics of the abovementioned memory device, it is possible to utilize this device as a voltage source for providing a voltage variable in response to manual operation to a voltage controlled variable reactance device employed in an automatic tuning apparatus.

It is pointed out that the present invention is applicable to a tuning apparatus employing a voltage controlled variable reactance device which is supplied with a voltage from any type of voltage source.

SUMMARY OF THE INVENTION

Briefly stated, the present invention comprises an apparatus for indicating a tuned frequency of a tuner of a receiver, said tuner comprising a tank circuit employing a voltage controlled variable reactance device, such as a voltage controlled variable capacitance diode, which is supplied with a control voltage as determined for the purpose of tuning to said frequency, said indicating apparatus comprising a plurality of indicating means arranged in order, each corresponding to one of a plurality of divided frequency regions of a frequency band to be received by said receiver, and means responsive to said control voltage for energizing the corresponding indicating means for indicating the corresponding frequency region to which said tuned frequency pertains.

In a preferred embodiment of the present invention, the frequency regions to be covered by the adjacent indicting means are adapted to be overlapped in part at the ends thereof, so that the frequency in the non-overlapped portion in the region is indicated by only one indicating means while the frequency in the overlapped portion in the region is indicated by two adjacent indicting means, with the result that finer indication is possible with a less number of indicating means.

Therefore, it is a principal object of the present invention to provide a solid state device for indicating a tuned frequency in a tuning apparatus employing a voltage controlled variable reactance device.

It is another object of the present invention to provide a solid state device for indicating a tuned frequency in a tuning apparatus employing a voltage controlled variable reactance device by energizing one of a plurality of indicating means arranged in order, each corresponding to one of a plurality of divided frequency regions of a frequency band to be received by said tuner, for indicating the corresponding frequency region to which said tuned frequency pertains.

It is a further object of the present invention to provide an improved solid state device for indicating a tuned frequency in a tuning apparatus employing a voltage controlled variable reactance device by energizing one of a plurality of indicating means arranged in order, each corresponding to one of a plurality of divided frequency regions of a frequency band to be received by said tuner, for indicating the corresponding frequency region to which said tuned frequency pertains, wherein finer indication is possible with a less number of indicating means.

These objects and other objects and features of the present invention will be better understood when taken in conjunction with the following detailed description made with reference to the accompanying drawings.

BRIEF DESCRIPTION OF THE DRAWINGS

FIGS. 2 and 3 illustrate a plan view of a display panel of the tuning indicating apparatus of a radio receiver and a television receiver, respectively, which employ the present invention, FIG.4 is a graph showing a relation between the frequency selected by the tuner 21 and a control voltage applied to the voltage controlled variable capacitance diode VC of the tuner 21, FIG. 6 illustrates a graph showing a relation between a voltage applied to between a base and an emitter of the transistor Tr3 and time, FIG. 7 illustrates another embodiment of the driver circuits of the present invention, which has been modified from the FIG. 5 driver circuits, FIG. 8 illustrates a few different manners of indication in accordance with the present invention, FIGS. 14A and 14B illustrate a schematic diagram of a driver circuit for light emitting devices of a still further embodiment of the present invention.

DESCRIPTION OF THE PREFERRED EMBODIMENTS

Figure 1:
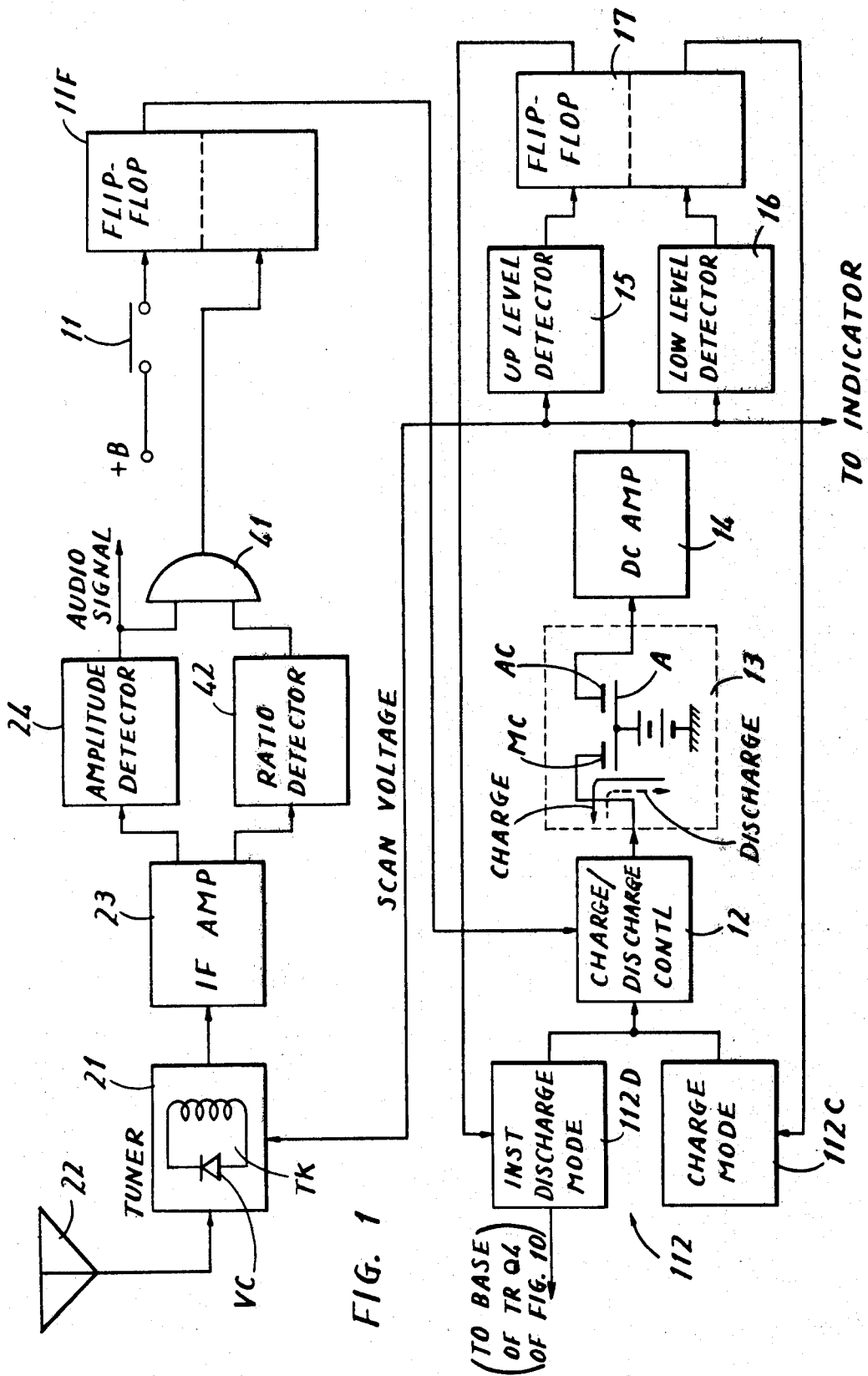
FIG. 1 illustrates a block diagram of a radio receiver employing an automatic tuning apparatus having a tuning circuit employing a voltage controlled variable capacitance diode which is supplied with a control voltage from a voltage source using a solid state potential memory device, in which the present invention is advantageously embodied.

FIG. 1 illustrates a block diagram of a radio receiver employing an automatic tuning apparatus having a tuning or tank circuit employing a voltage controlled variable capacitance diode which is supplied with a scanning control voltage from a voltage source using the abovementioned potential memory device, in which the present invention is advantageously embodied as to be more fully described subsequently. A major portion of a typical radio receiver is shown in the upper half portion of the FIG. 1 diagram, which comprises an antenna 22, a tuner 21, an intermediate frequency amplifier 23, an amplitude detector 24 and subsequent audio stages, which are well known and therefore not shown. The tuner 21 usually comprises a high frequency amplifier, a local oscillator and a mixer. For the purpose of embodying the present invention, the tuner 21 of the radio receiver shown further comprises a voltage controlled variable reactance devices VC, which are connected so as to constitute a part of a tuning circuit TK for the high frequency amplifier and the local oscillator. A typical and preferred voltage controlled variable reactance device of a solid state type now commercially available is a voltage controlled variable capacitor. As described in the foregoing, such a voltage controlled variable capacitor uses a capacitance formed at a barrier portion of a semiconductor diode, which is variable as a function of a reverse voltage applied thereacross, and is also known as a variable capacitance diode. However, it should be understood that any type of a voltage controlled variable reactance device can be used for the purpose of the present invention, so far as it is available FIG. 1 also shows in the half portion thereof an embodiment of an automatic tuning apparatus incorporated in the abovementioned radio receiver. Briefly stated, the automatic tuning apparatus shown is enabled to start automatic tuning operation by manual operation of a switch, which causes the abovementioned potential memory device to be charged or discharged and thus the varible voltage thereacross to be applied to the voltage controlled variable capacitance diode connected associated with tuning circuits in the tuner, until any one of the broadcasting stations is selected as a result of tuning in the tuner, when a tuning output is obtained in a form of an intermediate frequency signal from the intermediate frequency amplifier, which is used to stop charging or discharging of the potential memory device, with the result that a frequency of a given transmitting station is atuomatically selected. A further detailed description of the automatic tuning apparatus shown is given in the following with particular reference to the lower half portion of the FIG. 1 diagram.

Referring again to FIG. 1, the automatic tuning device comprises a manually operable switch 11 for starting the scanning of a broadcasting frequency band, which comprises an upward scanning switch, which is energized by a + B voltage source and is connected to a set input of a flip-flop 11F. A reset input to the flip-flop 11F is connected from an output of an AND gate 41. One input of the AND gate 41 is supplied with an audio signal from the amplitude detector 24, while the other input of the AND gate 41 is supplied with an output from a frequency detector 42 such as a ratio detector coupled to the intermediate frequency 23 for detecting the frequency of the intermedite frequency output. A charging/discharging control circuit 12 is provided to control charging or discharging of a potential memory device 13 as a function of an output from the switch 11 and a disabling signal associated with an output from the intermediate frequency amplifier, as to be described hereinafter. An output of the potential memory device 13 is supplied to a DC amplifier 14. An output from the amplifier 14 is fed to the tuner 21 as the scanning control voltage. In the tuner 21, an output from the DC amplifier 14 is fed to the voltage controlled variable capacitor VC in a reverse direction, as well known in those skilled in the art. An output from the amplifier 14 is also fed to an upper threshold detector 15 and a lower threshold detector 16, so that either of outputs from detectors 15 and 16 in response to a predetermined upper thresold or lower threshold of the output from the amplifier 14 sets or resets a flip-flop 17, respectively. The reset output of the flip-flop 17 is connected through a charge mode control circuit 112C to the charging/discharging control circuit 12, so that the circuit 12 is caused to effect the charging operation mode, while the set output of the flip-flop 17 is connected through an instantaneous discharge mode control circuit 112D to the charging/discharging control circuit 12, so that the circuit 12 is caused to effect the instantaneous discharging operation mode.

The potential memory device 13 may be the same as the FIG. 6 embodiment disclosed in the patent referenced previously. More specifically, the potential memory device 13 comprises a main cathode MC and a auxiliary cathode AC of Ag, an anode A of an Ag-Te alloy, and a solid state electrolyte having high ion conductivity, such as $RbAg_4I_5$ sandwiched between the cathodes MC and AC and anode A. The main cathode MC is connected to an output of the charging/discharging control circuit 12 for the purpose of charging or discharging of the memory device 13, while the auxiliary cathode AC is connected to an input of the DC amplifier 14 for the purpose of detecting the terminal voltage of the memory device 13. When a DC voltage is applied to the device 13 so that the main cathode MC may be negative, a charging current flows from the anode A to the cathodes MC and AC and a portion of Ag contained in the anode A migrates over to the cathodes, resulting in an increased terminal voltage. This operation is referred to as "charging" in the present specification. On the other hand, when a DC voltage is applied to the device 13 in the reverse direction as compared with the former case, Ag is refilled into the anode A, resulting in the decreased terminal voltage. This operation is referred to as "discharging" in the present specification.

The operation of the FIG. 1 embodiment will be better understood by the following description. For the purpose of describing the operation of the embodiment shown, first let it be assumed that the scanning switch 11 is manually operated. Further let it be assumed that no radio broadcasting signal has been broadcast in the frequency band and the flip-flop 17 has been reset so that the circuit 12 is caused to be in the charging mode. When the scanning switch 11 is manually operated, the flip-flop 11F is set and the charging/discharging control circuit 12 is enabled and thus the potential memory device 13 is charged, as specifically defined in the present specification. If the device 13 had been caused to continue further the charging mode, then the device 13 would have been destroyed because of overcharging. However, in the embodiment shown, an output from the DC amplifier 14, which corresponds to the upper threshold voltage of the device 13 but has been amplified by the amplifier 14, is threshold-detected by the upper threshold detector 15 to cause the flip-flop 17 to be set. Therefore, no reset output from flip-flop 17 is applied to the charge mode control circuit 112C while a set output from the flip-flop 17 is applied to the instantaneous discharge mode control circuit 112D so that the control circuit 12 is caused to be in an instantaneous mode, and thus the potential memory device 13 is instantaneously discharged, as specifically defined in the present specification. In the embodiment shown, an output from the DC amplifier 14, which corresponds to the lower threshold voltage of the device 13 reached by the instantaneous discharging but has been amplified by the amplifier 14, is threshold-detected by the lower threshold detector 16 to cause the flip-flop 17 to be reset. The reset output from the flip-flop 17 is applied thereafter to the charge mode control ciruit 112C so that the control circuit 12 is caused to be in a charging mode again. Thereafter the same operation is repeated as mentioned above.

It is understood from the foregoing description that in a time period of the charging mode a set output is provided from the flip-flop 17 to enable the control circuit 112C and in a time period of the instantaneous discharge mode a reset output is provided from the flip-flop 17 to enable the control circuit 112D. Therefore, in the charging and discharging mode periods of time an output from the DC amplifier 14 is applied to the tuner 21.

As described previously, in the tuner 21, the said output is applied as a scanning control voltage to voltage controlled variable capacitors connected associated with the tuning circuits for a high frequency amplifier and a local oscillator. Therefore, it is understood that it is necessary to choose a range of change in voltage of the memory device such that the said range suffices to cover voltage values which are required to receive all the broadcasting frequencies by the use of the tuner 21 employing the said voltage controlled variable capacitor so as to be supplied with the said voltage values.

Now let it be assumed that some radio broadcasting stations are broadcasting using different frequencies in a certain area. Further let it be assumed that the potential memory device 13 has been discharged to an initial point. When the scanning switch 11 is manually operated, the flip-flop 11F is set and the automatic tuning apparatus is caused to be in a charging mode, or an upward scanning mode. When a voltage at the output terminal of the potential memory device 13 comes to corresponds to a frequency of carrier valve in which a radio signal has been broadcast, the tuner 21 automatically makes tuning to the frequency and selects the transmitting station, so that an intermediate frequency output is provided at the intermediate frequency amplifier 23 and an output is provided from the level detection circuit 24. Just when the tuner 21 makes precise tuning to the frequency, an output is also provided from the ratio detector 42. Therefore, the input condition of the gate 41 is met and an output is obtained from the gate 41. The output from the AND gate 41 resets the flip-flop 11F and thus disables the charging-/discharging control circuit 12 so that charging mode is discontinued thereafter. Such a state as thus established is kept unchanged and thus the voltage of the memory device 13 remains the same until a further manual operation of the switch 11. Upon such a manual operation of the switch 11, the charging/discharging control circuit 12 is again forced to an enabled condition of the charging mode, so that the radio frequency band is scanned in the abovementioned manner from the lower frequency channel to the higher frequency channel, until another channel now in broadcasting is selected by the tuner 21. When the voltage to be supplied to the tuner comes to be the upper threshold value, the state of the flip-flop 17 is changed so that the charging/discharging control circuit 12 is controlled to be in an instantaneous discharge mode. This makes the further tuning to be effected again from the lower frequency channel to the higher frequency channel upon manual operation of the switch 11.

In the foregoing description, the present invention has been described as embodied in the radio receivers. However, it is pointed out that the description given hereinabove can be applied to television receivers, and any other type of receivers under proper modifications which are obvious to those skilled in the art.

It is understood to those skilled in the art that a control voltage which is applied to a voltage controlled variable capacitance diode VC of the tuner 21 from the amplifier 14, and a frequency which the tuner 21 selects in response to the control voltage are in close relationship with each other. The present invention provides a novel device for indicating the selected frequency, by the use of the output from the amplifier 14. Referring to FIG. 1, such an output is represented with letters "TO INDICATOR". The indicating device of the present invention using such an output will be described hereinafter in detail.

FIG. 2 and 3 illustrate a plan view of a display panel of a tuning indicating apparatus of a radio receiver and a television receiver, respectively, which employ the present invention. As apparent from these drawings, each of the receiving frequency bands (AM, FM, VHF, UHF) is divided into a plurality of frequency indicating regions, and one light emitting device such as A, B, C . . . F is mounted to illuminate the region in each divided frequency indicating region. These light emitting devices A, B, C . . . F are energized and radiated individually only while the tuner 21 is tuning to the frequency which pertains to the respective divided frequency region. Thus, it indicates that the tuner 21 is tuning to a frequency which pertains to the frequency region corresponding to the radiating light emitting device.

FIG. 4 is a graph showing a relation between the frequency selected by the tuner 21, and a voltage applied to the voltage controlled variable capacitance diode VC of the tuner 21, in which an ordinate represents the voltage and an abscissa represents the frequency. Referring to FIG. 4, the divided frequency indicating ranges A'', B'', C'' . . . F'', its respective central frequencies A', B', C' . . . F', and their corresponding voltage ranges $a'$, $b'$, $c'$ . . . $f'$, and the respective central voltages $a$, $b$, $c$ . . . $f$ are shown at the same time. Referring to the illustrated embodiment, it is pointed out that the divided frequency ranges A'', B'', C'' . . . F'' are equidistantly spaced. As described more fully hereinafter, referring to the illustrated and described embodiment, a plurality of reference voltages corresponding to the DC voltages $a$, $b$, $c$ . . . $f$ are prepared. The control voltage which is applied to the voltage controlled variable capacitance diode is compared with the reference voltages. While the control voltage is in a range corresponding to the voltage range with one of the reference voltages as a center, a light emitting device in the corresponding frequency indicating region thereof is adapted to be energized.

Figure 5:
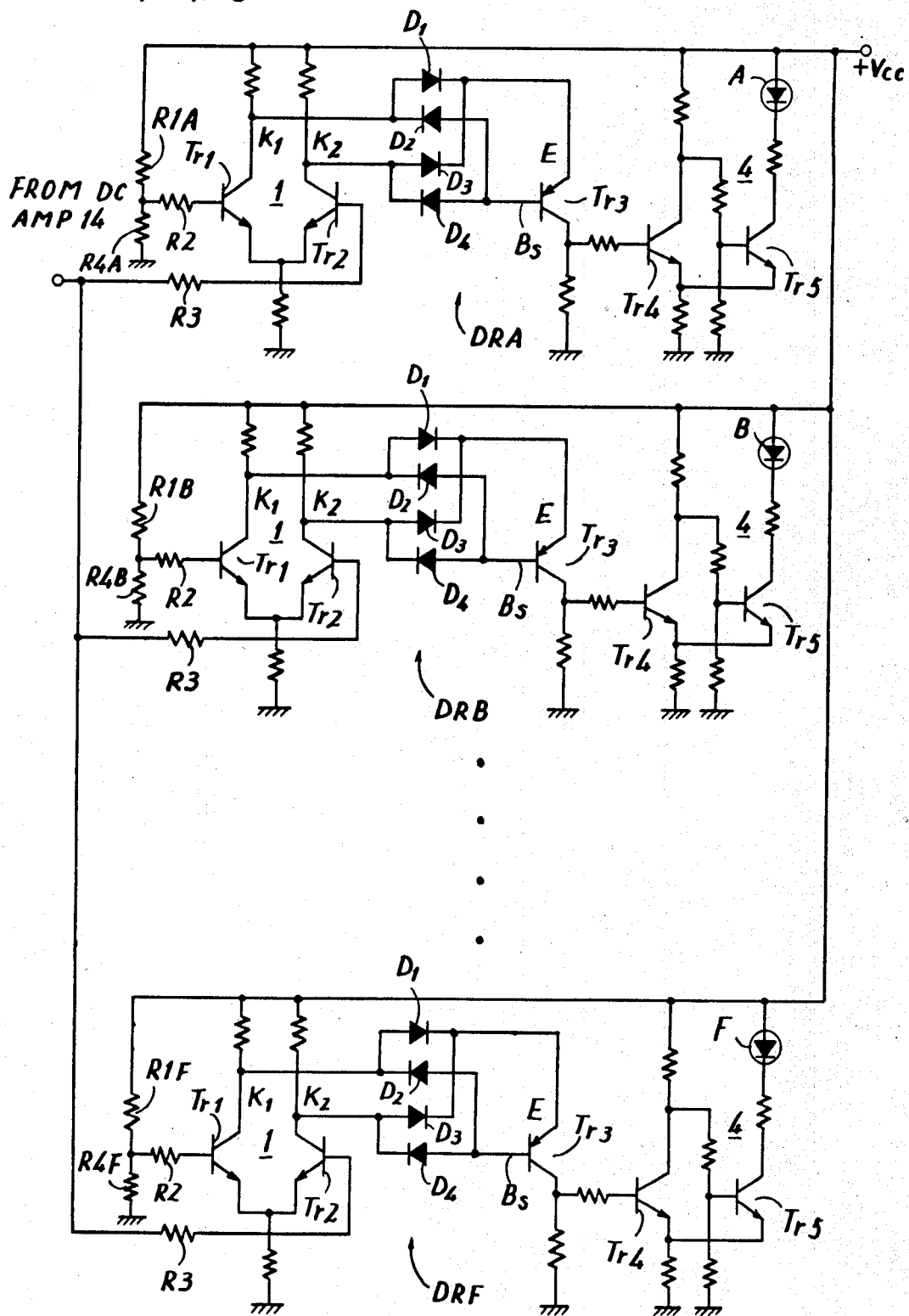
FIG. 5 illustrates a schematic diagram of driver circuits for light emitting devices A, B, C, F, which embodies the present invention.

FIG. 5 illustrates driving circuits of the light emitting devices A, B, C . . . F which embody the present invention. As apparent from the illustration of FIG. 5, the embodiment of FIG. 5 includes a plurality of driving circuits DRA, DRB, DRC . . . DRF of the same circuit configuration for driving the light emitting devices A, B, C . . . F, respectively, some of these driving circuits being omitted in dotted lines. Therefore, the same portions are represented by the same reference characters throughout the figure. One of these driving circuits, say, the circuit DRA, will be described hereinafter in detail.

A pair of transistors Tr1 and Tr2 constitute a comparator 1 of a differential amplifier type, and a predetermined reference voltage which corresponds to the voltage "a" is applied through a resistor R2 to the base of one transistor Tr1. The reference voltage is established by means of a voltage divider which is comprised of resistors R1A and R4A. The DC scanning voltage is adapted to be applied through a resistor R3 to the base of the other transistor Tr2. The resistors R1A, R1B, R1C . . . R1F and R4A, R4B, R4C . . . R4F which constitute the voltage divider for generating the reference voltages have their resistance ratio varied in succession for the driving circuits DRA, DRB, DRC . . . DRF, respectively. Therefore, the reference voltages which are applied to the respective driving circuits are voltages each having a different value, which has been set, respectively, correspondingly to the voltages $a$, $b$, $c$ . . . $f$, while the scanning voltage is applied commonly to each circuit. The base resistors R2 and R3 are desirably so high as to eliminate the effects of the comparator upon the reference voltage source and the scanning voltage source. Referring to FIG. 5, diodes D1, D2, D3 and D4 are inserted to adjust the direction of the voltage so that it may be applied in a forward bias direction normally to the transistor Tr3 of the next stage, irrespective of the magnitude relationship between the outputs of comparator 1, namely, a first output appearing in the collector K1 of the transistor Tr1 and a second output appearing in the collector K2 of the transistor Tr2. The switching transistor Tr3 functions as a threshold detector which turns on when the single voltage exceeds a threshold voltage level L to be described later with reference to FIG. 6, and turns off when it is lower then the level L. At the same time, the transistor Tr3 functions to convert, into a voltage with respect to the ground voltage, the output of the comparator 1 which is floated from the ground. Transistors Tr4 and Tr5 constitute a Schmidt circuit 4 and light emitting devices (light emitting diodes) A, B, C . . . F are connected as a load to the collector of one Tr5 of the transistors. The circuit is energized by a direct current bias power source voltage + Vcc.

Now the operation of the display driving circuit of FIG. 5 will be described with reference to FIG. 6. FIG. 6 is a graph showing a relation between the voltage applied to between a base and an emitter of the transistor Tr3, and the time. A predetermined reference voltage is applied to the base of the transistor Tr1 constituting the comparator 1, but a scanning voltage for tuning is applied to the base of the other Tr2 of the transistors. Thus, the output voltage which appears in the collectors of the transistors Tr1 and Tr2 also changes in accordance with the magnitude of these two input voltages.

Assume that the reference voltage is higher than the scanning voltage. The potential at the collector K2 of the transistor Tr2 becomes higher than the potential at the collector K1 of the transistor Tr1. The forward direction bias is applied to between the emitter and the base of the switching transistor Tr3 through the path of the collector K2 → the diode D3 → the emitter E of the transistor Tr3 → the base Bs thereof → the diode D2 → the collector K1 of the transistor Tr1. Accordingly, the transistor Tr3 turns onn and the collector potential rises. As a result, one Tr4 of the transistors constituting the Schmidt circuit 4 becomes conductive, and the other Tr5 thereof becomes non-conductive. Accordingly, the light emitting diode does not light.

However, the scanning voltage rises gradually to a point in the vicinity of the reference voltage, namely, to a point VI of FIG. 6, and the potential difference between the output terminals K1 and K2 of the transistors Tr1 and Tr2 of the comparator 1 becomes smaller. Accordingly, the voltage between the emitter and the base of the transistor Tr3 becomes smaller, and sufficient bias to actuate the transistor Tr3 is not applied any more at the threshold value L, thus resulting in non-conduction of the transistor Tr3. As a result, the collector of the transistor Tr3 drops to the ground potential, so that the transistor Tr4 constituting the Schmidt circuit 4 becomes non-conductive, and the transistor Tr5 becomes conductive, thus lighting up the light emitting diode.

As described hereinabove, the range wherein the light emitting diode is lit is defined to V1 to V3 including a point V2 where the scanning voltage and the reference voltage coincide with each other as shown in FIG. 6 and is determined by selection of the threshold valve L. As the scanning voltage becomes V3 or higher, the difference between the scanning voltage and the reference voltage becomes greater. Accordingly, the bias voltage of the switching transistor Tr3 becomes larger and the light emitting diode is put in the off condition again. Namely, when the output terminal K1 of the comparator 1 is of a potential higher than the terminal K2, the bias of sufficient large forward direction is applied to the switching transistor Tr3 through the path of terminal K1 → diode D1 → emitter E of transistor Tr3 → the base Bs thereof → diode D4 → terminal K2, and the transistor Tr4 turns on in response to the "on" condition of the transistor Tr3 and the transistor Tr5 is put in "off" condition. Thus, a current does not flow to the light emitting device. Referring to FIG. 6, the potential between the emitter and the base of the transistor Tr3 does not become negative in points of V2 or lower in scanning voltage. This is due to the functions of the diodes D1, D2, D3 and D4 inserted between the comparator 1 and the transistor Tr3 as described hereinbefore.

FIG. 7 shows a modified embodiment of driving circuits of FIG. 5, in which the comparator 1 is omitted and a transistor Tr6 is connected instead of the Schmidt circuit 4. In this embodiment, the reference voltage and the scanning voltage are applied directly to diodes D1, D2, D3 and D4, so that the respective supply source of both voltages must be of low impedance. The transistor Tr6 becomes non-conductive when the switching transistor Tr3 is in "off" condition, and the light emitting diode connected between the collector and the ground lights. However, when the switching transistor Tr3 is in "on" condition, the transistor Tr6 becomes conductive to drop the collector potential to the ground potential, so that the current does not flow to the light emitting diode. In case of this embodiment, the switching action becomes slower and detecting sensitivity becomes lower. However, the facts do not interfere with the practical use thereof.

FIG. 8 illustrates a few different manners of indication in accordance with the present invention. According to the embodiment described hereinabove, only the light emitting device mounted to be in response to the voltage range was to light when the scanning voltage is in either of the voltage ranges $a', b' \ldots f'$ as shown in FIG. 8 (a). However, if the adjacent voltage ranges $a'', b'' \ldots f''$ are set to be overlapped in part at the ends thereof, as shown in FIG. 8 (b), by a proper setting of circuit constants of the driving circuits of FIGS. 5 and 7, the adjacent two light emitting diodes light when the scanning voltage comes to the overlapping voltage range. Namely, as the scanning voltage increases gradually, the light emitting devices are lit in such an order as A → AB → B → BC → C → CD → . . . EF → F. In this manner, the frequency ranges approximately twice in number as many as the light emitting devices can be judged and discriminated between them, so that the light emitting diodes and their accompanying circuits can be decreased.

Figure 9:
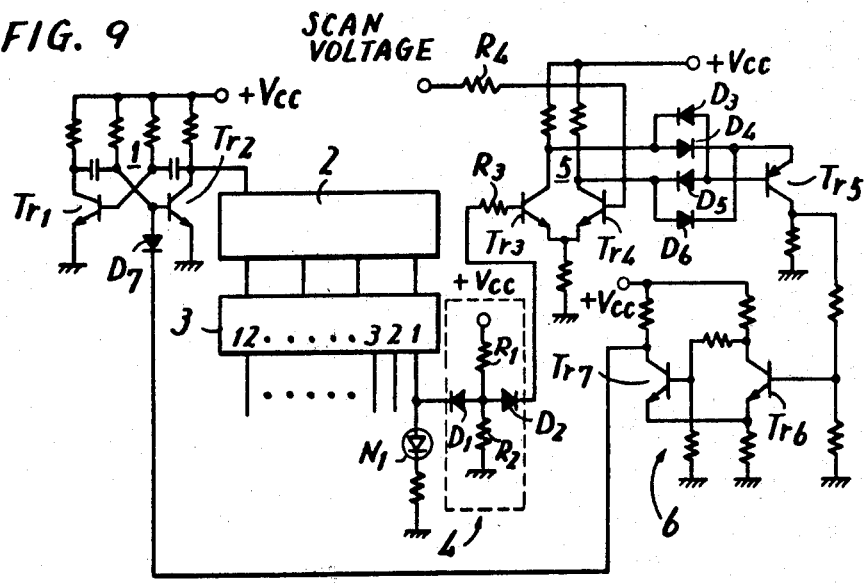
FIG. 9 illustrates a schematic diagram of a driver circuit for light emitting devices of a further embodiment of the present invention.

FIG. 9 is a diagram of a driver circuit for lighting light emitting devices in a further embodiment of the television receivers employing the present invention. Transistors Tr1 and Tr2 constitute a clock pulse generator 1. The clock pulse generator is adapted to operate in response to the scanning start switch (11 of FIG. 1) for enabling the scanning voltage supply of the tuner. Pulses from the lock pulse generator 1 are applied to the BCD counter 2 for making a binary counting operation in 4 bits, and a decoder 3 for converting the binary number of the 4 bits into a decimal number is connected to the four output lines of the BCD counter. Briefly stated, the function of the decoder 3 is to individually specify or identify one of, for example, twelve output terminals in accodance with the contents of the 4 bits appearing in the output of the counter. The specifying or identifying is adapted to move sequentially of the twelve output terminals at a considerably fast speed during the generating operation of the pulse generator. A ring counter can be used, instead of the BCD counter 2, in which case the decoder 3 can be omitted. Referring to the figure, a reference voltage circuit 4 is connected to the individual output terminal of the decoder 3, comprising resistors R1 and R2 and diodes D1 and D2 and a voltage source + Vcc. The output end thereof is connected to a comparator 5. A light emitting diode N1 is inserted between the output terminal of the decoder and the ground.

Only one reference voltage circuit 4 and one light emitting diode N1 are shown in detail. In actuality, twelve sets in all of the circuit 4 and the diode N1 are provided, one set for each individual output of the decoder 3, respectively. However, it is to be understood that the values of reference voltages to be set by each reference voltage circuit in this case are different from each other.

Transistors Tr3 and Tr4 constitute the comparator 5 of a differential amplification type. The reference voltage is selectively given through a resistor R3 to the base of one transistor Tr3 and the scanning voltage which is applied to the tuner 21 from the DC amplifier 14 (FIG. 1) through a resistor R4 is adapted to be supplied to the base of the other transistor Tr4. It is desirable that the base resistors R3 and R4 are so high as to eliminate the effects of the comparator upon the reference voltage source and the scanning voltage source. Diodes D3, D4, D5 and D6 have been inserted to adjust the direction of the voltage so that it may be applied in a forward bias direction normally to the transistor Tr5 of the next stage, irrespective of the magnitude relationship between the outputs of the comparator 5, namely, a first output appearing in the collector of the transistor Tr3 and a second output appearing in the transistor Tr4. The transistor Tr5 functions as a switching transistor so that it turns on when the signal voltage exceeds a given threshold voltage level, and turns off when it is lower than the threshold level. At the same time, the transistor Tr5 functions to convert, into voltage with respect to the ground voltage, the output of the comparator 5 which is floated from the ground. Transistors Tr6 and Tr7 constitute a Schmidt circuit 6, and the collector of the one transistor Tr7 is connected through a diode D7 to the base of transistor 1 constituting the clock pulse generator. The circuits of FIG. 9 is energized by a direct current power source + Vcc.

The operation of a display circuit of FIG. 9 constituted as described hereinabove will be described hereinafter. Upon operating a scanning start switch (11 of FIG. 1), the scanning of the direct current voltage to be applied to the voltage controlled variable capacitance diode (VC of FIG. 1) starts, and the clock pulse generator 1 is actuated to generate the clock pulses at the output.

The counter 2 counts the number of pulses and the decoder 3 sequentially provides an output at one of the output terminals to which the reference voltage circuits are connected. For example, in a case where a first channel is specified, the level of the first terminal of the decoder 3 to which the reference voltage circuit 1 for the first channel is connected becomes high, while the level of other terminals remains low. As a result, the diode D1 in the reference voltage circuit 4 for the first channel is reversely biased, and a voltage which has been divided from the direct current power voltage Vcc by resistors R1 and R2 is given to the comparator 5 through the diode D2. In a case where a reference voltage supplied to the base of the transistor Tr3 is lower than a scanning voltage supplied to the base of the other transistor Tr4 in the comparator 5, the collector potential of the transistor Tr3 becomes higher than the collector potential of the transistor Tr4. The forward bias is applied between the emitter and the base of the switching transistor Tr5 throuth the loop of the collector of the transistor Tr3 → the diode D4 → the emitter of the transistor Tr5 → the base thereof → the diode D5 → the collector of the transistor Tr4. The transistor Tr5 becomes on and the collector potential rises. As a result, one Tr6 of the transistors constituting a Schmidt circuit 6 becomes conductive, and the other Tr7 thereof becomes nonconductive. Accordingly, the collector potential of the transistor Tr7 becomes positive. Since a reverse bias is applied to the diode D7, the clock pulse generator 1 still continues its generator. However, when the scanning voltage rises gradually to a voltage value equivalent to the reference voltage, the potential difference between a pair of output ends of the comparator 5 becomes smaller. Accordingly, the voltage between the emitter and the base of the switching transistor Tr5 becomes smaller. Since the sufficient bias to actuate the transistor Tr5 is not applied any more, the transistor Tr5 becomes non-conductive. As a result, since the collector of the transistor Tr5 drops to the ground potential, the one transistor Tr6 constituting the Schmidt circuit 6 becomes non-conductive, and the other transistor Tr7 becomes conductive. Since the conduction of the transistor Tr7 causes its collector potential to be close to the ground potential, the forward bias is applied to the diode D7 connected to the collector, and thus the diode D7 becomes conductive.

Accordingly, the base potential of the transistor Tr2 constituting the clock pulse generator 1 drops to the ground potential, and the generation stops. Thus, pulses are not applied to the counter 2. Upon stopping of the generation, the light emitting diode which was lit upon stopping the generation continues its light condition and effects its tuning display.

In a case where the scanning voltage is relatively lower than the reference voltage, the collector potential of the one transistor Tr3 constituting the comparator 5 becomes lower than the collector potential of the other transistor Tr4. But the forward bias is applied to the switching transistor Tr5 through the path comprising the collector of the transistor Tr4 → the diode D6 → the emitter of the transistor Tr5 → the base thereof → the diode D3 → the collector of the transistor Tr3, so that the clock pulse generator does not stop the operation described hereinabove. However, the clock pulse generator stops the operation where the reference voltage becomes almost equal to the scanning voltage, so that switching of the lighting of the light emitting devices stops to effect the tuning display.

Subsequently, upon operation of the operating switch (11 of FIG. 1) again to switch the channel, the scanning voltage changes and the clock pulse generator is enabled again. Correspondingly, the lighting of the light emitting diode changes throughout twelve light emitting diodes at a considerably fast speed. In a channel where the scanning voltage to be applied to the comparator 5 has been equal to the reference voltage, the generation stops and the light emitting diode corresponding to the channel keeps its lighting, thus effecting the tuning display of the corresponding channel.

Figure 10:
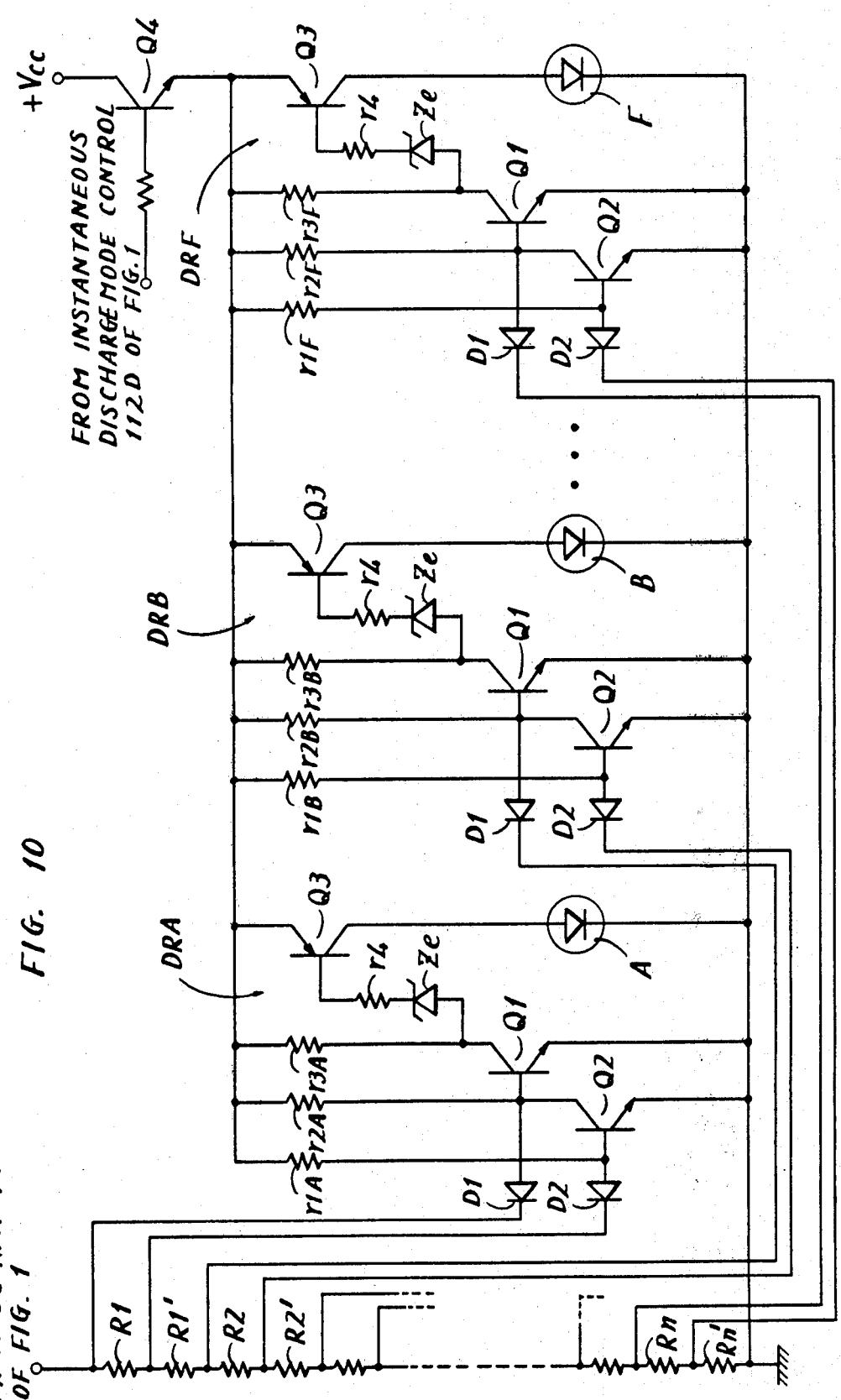
FIG. 10, illustrates a schematic diagram of a driver circuit for light emitting devices of a still further embodiment of the present invention.

FIG. 10 illustrates a still further embodiment of a driver circuit for the light emitting devices A, B, C . . . F which employ the present invention. According to the illustrated embodiment, the scanning voltage V obtained from the DC amplifier 14 of FIG. 1 is divided by voltage division resistors R1, R1'; R2, R2'; R3, R3' . . . Rn, Rn', respectively, for the light emitting devices A, B, C . . . F, and is applied through a diode D1 to the base of a first transistor Q1 of each driving circuit and through a diode D2 to the base of a second transistor Q2.

Figure 11:
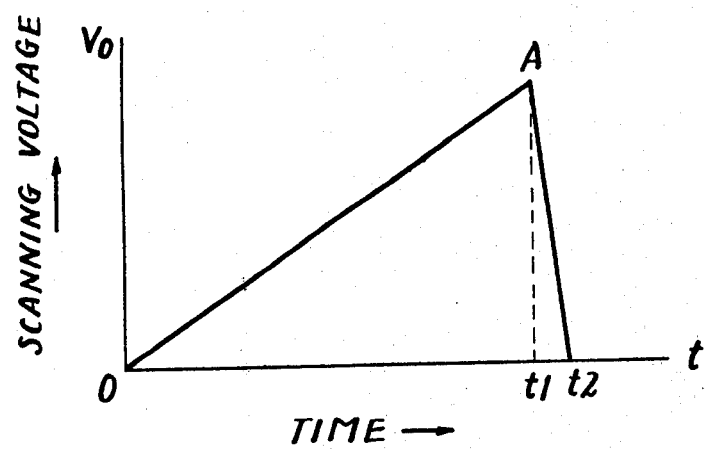
FIG. 11 illustrates a wave form of a scanning voltage obtained from the DC amplifier 14 of the FIG. 1 automatic tuning apparatus.
Figure 12:
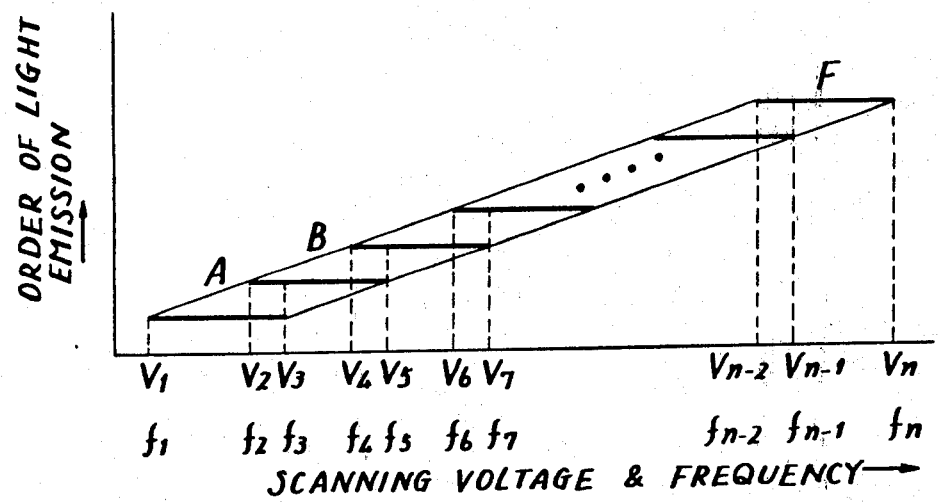
FIG. 12 is a graph for explanation of operation of the FIG. 10 embodiment, showing a relation between a voltage and frequency (abscissa) and a state of light emission (ordinate)
Figure 13:
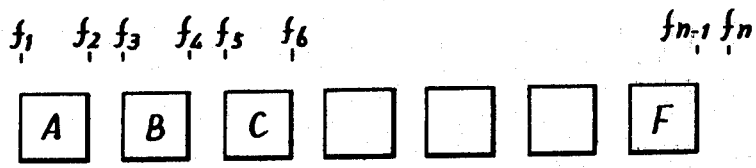
FIG. 13 illustrates a relation of an arrangement of the light emitting device A, B, C . . . . F of the display panel and the frequency.

FIG. 11 illustrates a wave form of a scanning voltage obtained by the DC amplifier 14 of FIG. 1. FIG. 12 is a graph for explanation of operation of the FIG. 10 embodiment, showing a relation between a voltage and frequency (abscissa) and a state of light emission (ordinate). FIG. 13 illustrates a relation of an arrangement of the light emitting devices A, B, C . . . F of the display panel, and the frequency. The circuit operation of FIG. 10 will be described hereinafter with reference to FIGS. 11, 12 and 13. Assume that a rising voltage Vbe between the emitter and the base of the transistors Q1 and Q2 of a driver circuit DRA of the circuit of FIG. 10 is Vbe = V1. However, as shown in FIG. 12, assume that the scanning voltage V rises to V1, and a receiving frequency $f$ at this time is $f1$, and the transistor Q1 begins to be conductive at this time. Accordingly, the collector of the transistor Q1 becomes approximately an ground potential 0 and the transistor Q3 is also conducted. Thus, a light emitting diode A for indicating the receiving frequency is lit. Upon further rising of the scanning voltage V to V3, the transistor Q1 continues its conduction. However, as the transistor Q2 begins to be conducted, the same conditions as the short-circuit between the base and the emitter of the transistor Q1 occurs. Accordingly, the transistor Q1 is cut off. As a result, the base potential of the transistor Q3 rises and the transistor Q3 becomes off, whereby the light emitting diode A is turned off.

On the other hand, referring to the driver circuit DRB of FIG. 10, the transistor Q1 begins to be conductive at a time when the scanning voltage V is V2, so that the light emitting diode B is lit in the same manner as described above. Upon further rising of the scanning voltage to V5, the transistor Q2 begins to be conductive and the transistor Q3 is cut off. Thus, the light emitting diode is turned off.

Such arrangement of the light emitting diodes A, B, C . . . F with an indication of the receiving frequencies $f1$, $f2$, . . . $fn$ thereabove in the display panel of the receiver as shown in FIG. 13 enables the light of the light emitting diode to indicate the frequency which is being scanned and received. Also, as shown in FIG. 12, the light emitting diodes A and B are both lit between the frequencies $f2$ and $f3$. As apparent better from FIG. 12, the lighting of both light emitting elements A and B indicates that the frequency between the $f2$ and $f3$ is being received.

In an automatic tuning circuit of FIG. 1, a saw tooth voltage as shown in FIG. 11 is obtained from the DC amplifier 14, and the voltage is applied to the variable capacitance diode VC of the tuner 11. Therefore, during the ordinary scanning period (namely, $0 - t1$ in FIG. 11), the local oscillation frequency and the receiving frequency indicating light are controlled by a scanning voltage on the slow slope of the saw tooth voltage, while the local oscillation frequency and the receiving frequency indicating light are adapted to be controlled even at a time of abrupt slope where the scanning voltage V is returned to the original condition quickly, i.e. a so called flyback period of $t1 - t2$ of FIG. 11. In using the tuning voltage of such saw tooth wave forms, no receiving signals are adapted to be reproduced normally during the flyback period. Nevertheless, the light emitting devices turn on and off quickly in sequence, during that period, thus giving uncomfortable impressions inconveniently.

In order to improve such disadvantages, in the embodiment illustrated in FIG. 10, the transistor Q4 for controlling the energization is turned off by signals appearing in an instantaneous discharge mode controlling circuit 112D (FIG. 1) during the instantaneous discharging of the electric potential memory device 13, whereby the light emitting diodes are adapted not to be on and off during the flyback period. Therefore, the problem is completely solved, which gives the viewers unpleasant impressions by turning on and off the receiving frequency indicating light during the flyback period in case of using the saw tooth voltage as the tuning voltage.

Figure 15:
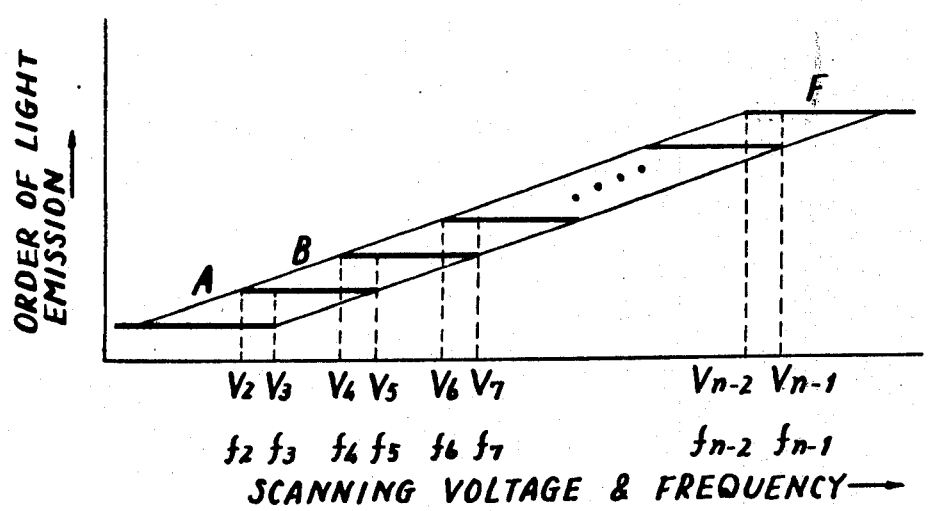
FIG. 15 is a graph similar to that of FIG. 12 for explanation of operation of the FIG. 14 embodiment.
Figure 14A:
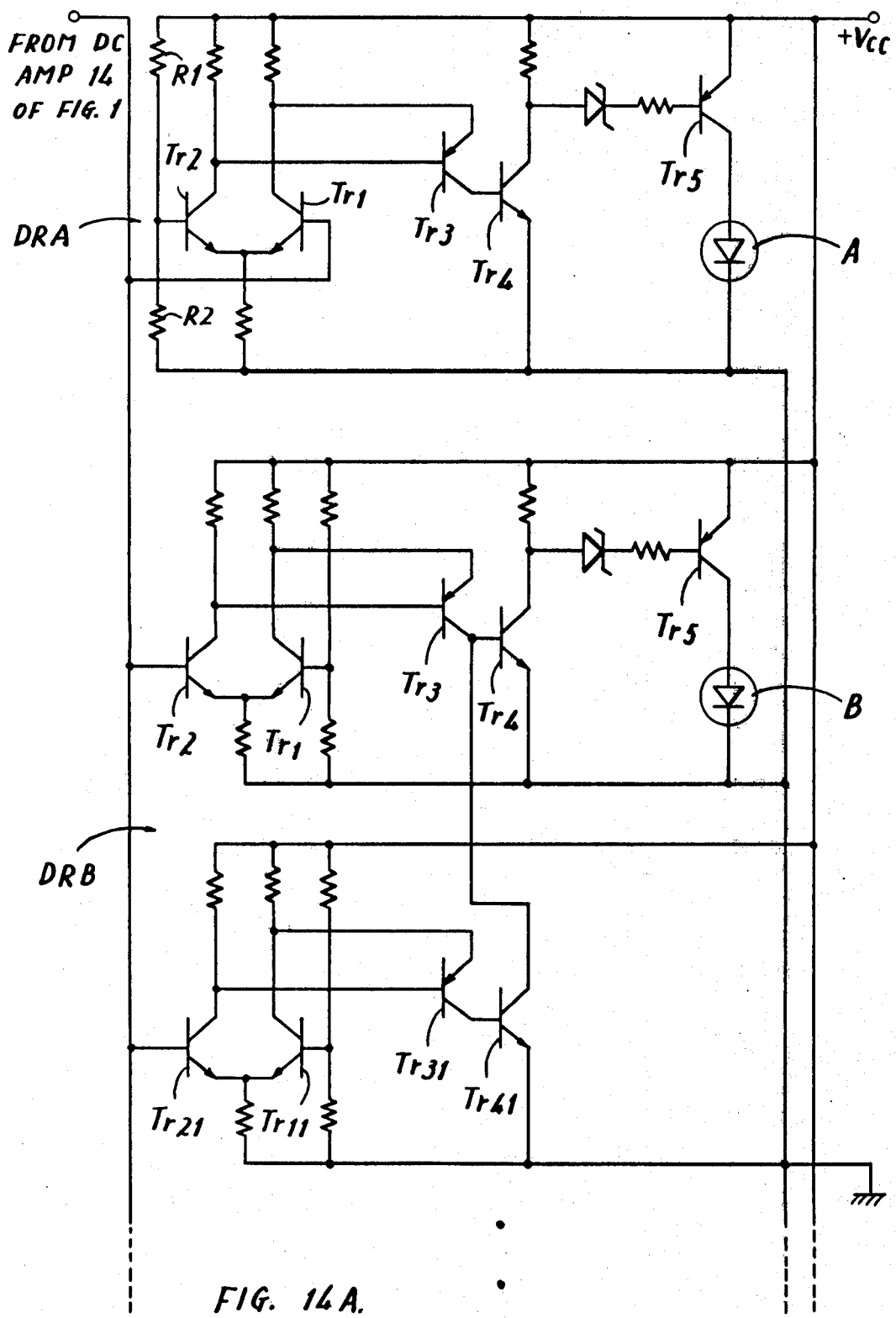

FIG. 14a and 14B illustrate a schematic diagram of a driver circuit, for light-controlling the light emitting devices A, B, C . . . F, of a still further embodiment of the present invention. The operation of the circuit 14 will be described with reference to the graph of FIG. 15, which is similar to the graph of FIG. 12. The driver circuit DRA for on/off controlling the light emitting device A to be turned on only when the scanning voltage is lower than a predetermined reference voltage V3 by resistors R1 and R2. More particularly, while the scanning voltage is lower than the reference voltage V3 determined by the resistors R1 and R2, the transistor Tr2 becomes more conductive. The collector voltage of the transistor Tr2 becomes lower than the collector voltage of the transistor Tr1. Thus, the forward bias is applied to between the emitter and the base of the transistor Tr3, whereby the transistor Tr3 becomes on. Accordingly, a base current flows to the transistor Tr4 to turn on the transistor Tr4. The transistor Tr5 is biased in the forward direction, and becomes on. The light emitting diode A is lit by the collector current flowing therethrough. The driver circuit DRB for on/-off controlling the light emitting device B comprises a circuit (upper half portion) responsive to the reference voltage V2, and a circuit (lower half portion) responsive to the reference voltage V5. The upper half circuit responds to the scanning voltage input exceeding the reference voltage V2 and the transistor Tr2 becomes more conductive than the transistor Tr1. The collector voltage of the transistor Tr2 becomes lower than the collector voltage of the transistor Tr1. Therefore, the forward bias is applied to between the emitter and the base of the transistor Tr3, and the transistor Tr3 becomes on. Accordingly, the upper half circuit operates, in the same manner as described about the driver circuit DRA, to enable the light emitting diode B to be lit. Similarly, the lower half circuit responds to the scanning voltage input exceeding the reference voltage V5 and the transistor Tr21 becomes more conductive than the transistor Tr11. Thus, the collector voltage of the transistor Tr21 becomes lower than the collector voltage of the transistor Tr11. The bias is applied in the forward direction to between the emitter and the base of the transistor Tr31. The transistor Tr31 and thus the transistor Tr41 become on. There is formed a short-circuit between the emitter and the base of the transistor Tr4 of the upper half circuit by conduction of the transistor Tr41. The transistor Tr4 becomes off, and the light emitting diode B stops its light emission. As a result, the driver circuit DRB responds to the scanning voltage in the range of V2 to V5 to enable the light emitting diode B. Likewise, the other driver circuits C, D and E respond and operate in different scanning voltage ranges.

The driver circuit DRF is similar to the driver circuit DRA, except that the reference voltage and the scanning voltage are applied to the different transistors, and the reference voltage is set to Vn−2. Therefore, the driver circuit DRF enables the light emitting diode F when the scanning voltage exceeds the reference voltage Vn−2.

As a top limit and a bottom limit in a voltage range wherein each driver circuit responsively operates, and accordingly in a frequency range, are set individually, the embodiment of FIG. 14 is advantageous in that such range is set accurately.

Although this invention has been described and illustrated in detail, it is to be clearly understood that the same is by way of illustration and example only and is not to be taken by way of limitation, the spirit and scope of this invention being limited only by the terms of the appended claims.

What is claimed is:

1. An indicating device for a tuning apparatus, said tuning apparatus comprising
   a voltage controlled variable reactance device, and
   means for supplying a variable amplitude control voltage to said voltage controlled variable reactance device, said variable control voltage causing changes in reactance of said voltage controlled variable reactance device in accordance with the amplitude of said control voltage and thus changes in a tuning frequency of said tuning apparatus for selectively receiving a broadcasting signal of a frequency band, said indicating device comprising;
   a plurality of frequency region visual indicating means, arranged in succession, for covering said frequency band to be received by said tuner, each visual indicating means corresponding to one of a plurality of frequency regions to which said frequency band is divided, and
   means responsive to the amplitude of said variable control voltage for selectively energizing the corresponding one of said plurality of frequency region visual indicating means, the frequency region of which indicating means includes a frequency tuned by said tuning apparatus as a function of the amplitude of said variable control voltage applied to said voltage controlled variable reactance device.

2. An indicating device for a tuning apparatus in accordance with claim 1, in which the frequency regions of adjacent frequency region indicating means are adapted to be overlapped in part at the ends thereof, whereby the amplitude of the control voltage corresponding to the frequency tuned by the tuning apparatus when in said overlapped portion of said frequency regions of said adjacent frequency region indicating means operates said energizing means so that said frequency tuned is indicated by both of said adjacent indicating means.

3. An indicating device for a tuning apparatus in accordance with claim 1, in which said energizing means comprises a plurality of comparator means, each said visual indicating means being respectively operated by a respective comparator means, each comparator means including
   means for providing a reference voltage of an amplitude different from that of each of the other comparator means, each said reference voltage corresponding to one of said plurality of frequency regions to which said frequency band is divided,
   means for comparing the amplitude of said variable control voltage with said reference voltage, and
   means responsive to an output from a said comparing means for selectively energizing the corresonding frequency region visual indicating means.

4. An indicating device for a tuning apparatus in accordance with claim 1, which further comprises
   means for setting a range of reference voltage amplitudes to which said energizing means is responsive for determining the frequency region to be indicated by each of said indicating means.

5. An indicating device for a tuning apparatus in accordance with claim 4, in which said range setting means comprises
   means responsive to the amplitude of said variable control voltage and the amplitude of said reference voltage for providing an absolute value of a difference of the amplitude of said variable control voltage and said reference voltage, and
   means for threshold detecting said absolute value of said difference.

6. An indicating device for a tuning apparatus in accordance with claim 3, in which said means for providing the plurality of reference voltages comprises
   means for providing a plurality of individual selection signals, each corresponding to one of said plurality of visual indicating means, and
   a plurality of different reference voltage sources to be selected in response to said individual selection signals.

7. An indicating device for a tuning apparatus in accordance with claim 6, in which said individual selection signal providing means comprises
   means for generating clock pulses,
   means responsive to said clock pulses for providing a stepping output, and
   means responsive to an output from said comparing means for controlling generation of said clock pulses.

8. An indicating device for a tuning apparatus in accordance with claim 3, in which each said comparing means comprises
   a pair of comparators, one of said comparators defining an upper limit of the corresponding frequency region, the other of said comparators defining a lower limit of the corresponding frequency region,
   means responsive to an output from one of said upper limit and lower limit defining comparators for enabling said energizing means, and
   means responsive to an output from the other of said upper limit and lower limit defining comparators for disabling said energizing means.

9. An indicating device for a tuning apparatus in accordance with claim 8, in which
   said enabling means comprises switching means responsive to said output from said one of said upper limit and lower limit defining comparators controllable to be in one state for enabling said energizing means, and
   said disabling means comprises means responsive to said output from said other of said upper limit and lower limit defining comparators for controlling said switching means to be in the other state.

10. An indicating device for a tuning apparatus in accordance with claim 3, in which said energizing means comprises
   a plurality of switching means for individually on/off controlling said plurality of indicating means,
   means responsive to the amplitude of said variable control voltage for enabling said plurality of switching means in turn at different enabling amplitudes of said variable control voltage, and
   means responsive to said variable control voltage for disabling said plurality of switching means in turn at different disabling amplitudes of said variable control voltage, said disabling amplitudes being each different from said enabling amplitudes for determining a voltage range corresponding to said frequency region.

11. An indicating device for a tuning apparatus in accordance with claim 1, in which said variable amplitude control voltage supplying means comprises
   means for holding a voltage at a certain amplitude, and
   means for controlling the amplitude of the voltage of said voltage holding means.

12. An indicating device for a tuning apparatus in accordance with claim 11, in which said voltage controlling means for selectively controlling the amplitude of the voltage in one direction or the other direction.

13. An indicating device for a tuning apparatus in accordance with claim 12, said voltage controlling means comprises means for effecting said control in one direction in a very short time.

14. An indicating device for a tuning apparatus in accordance with claim 13, which further comprises means for disabling said energizing means during a time period of said control in said one direction.

* * * * *